(12) United States Patent
Sugimoto et al.

(10) Patent No.: US 11,569,835 B2
(45) Date of Patent: Jan. 31, 2023

(54) ANALOG-TO-DIGITAL CONVERTER AND ELECTRONIC DEVICE

(71) Applicant: KABUSHIKI KAISHA TOSHIBA, Tokyo (JP)

(72) Inventors: Toshiki Sugimoto, Kawasaki Kanagawa (JP); Kentaro Yoshioka, Kawasaki Kanagawa (JP); Akihide Sai, Yokohama Kanagawa (JP); Yosuke Toyama, Yokohama Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 17/468,493

(22) Filed: Sep. 7, 2021

(65) Prior Publication Data
US 2022/0182067 A1    Jun. 9, 2022

(30) Foreign Application Priority Data

Dec. 7, 2020 (JP) .............................. JP2020-202955

(51) Int. Cl.
*H03M 1/12* (2006.01)

(52) U.S. Cl.
CPC ................................. *H03M 1/1255* (2013.01)

(58) Field of Classification Search
CPC .... H03M 1/1255; H03M 1/121; H03M 1/123; H03M 1/145; H03M 1/56
See application file for complete search history.

(56) References Cited

U.S. PATENT DOCUMENTS

| 7,030,800 | B2 * | 4/2006 | Arai | ...................... | H03M 1/188 |
| | | | | | 341/155 |
| 2010/0164768 | A1 * | 7/2010 | Mitikiri | .................. | H03M 1/186 |
| | | | | | 341/161 |
| 2016/0006336 | A1 * | 1/2016 | Bennett | .................. | H02M 3/156 |
| | | | | | 323/271 |
| 2021/0203345 | A1 * | 7/2021 | Chen | ................... | H03M 1/1245 |
| 2022/0271765 | A1 * | 8/2022 | Craninckx | .............. | H03M 1/56 |

OTHER PUBLICATIONS

R. van Veldhoven, et al., "A Low-Cost 4-Channel Reconfigurable Audio Interface for Car Entertainment Systems," 2020 IEEE Int'l Solid-State Circuits Conf. (ISSCC), Session 9, pp. 168-170 (2020).
R. Reeder, et al., "Pushing the State of the Art with Multichannel A/D Converters," Analog Dialogue, vol. 39-05, 4 pages (2005).

* cited by examiner

*Primary Examiner* — Lam T Mai
(74) *Attorney, Agent, or Firm* — Finnegan, Henderson, Farabow, Garrett & Dunner, LLP

(57) ABSTRACT

An analog-to-digital converter has a first digital signal generator that generates a first digital signal based on whether or not a sampling signal of an input signal is equal to or lower than a signal corresponding to a second reference signal higher than a first reference signal, a first slope generator to generate a first slope signal that changes with time from the sampled and held signal equal to or lower than the first reference signal, a second slope generator to generate a second slope signal that changes with time from the sampled and held signal to a signal level equal to or lower than the second reference signal, and a second digital signal generator that generates a second digital signal based on a time at which the first slope signal matches the first reference signal or a time at which the second slope signal matches the second reference signal.

20 Claims, 14 Drawing Sheets

ANALOG-TO-DIGITAL CONVERTER AND ELECTRONIC DEVICE

CROSS REFERENCE TO RELATED APPLICATIONS

This application is based upon and claims the benefit of priority from the prior Japanese Patent Application No. 2020-202955, filed on Dec. 7, 2020, the entire contents of which are incorporated herein by reference.

FIELD

An embodiment of the present invention relates to an analog-to-digital converter and an electronic device.

BACKGROUND

A single slope type analog-to-digital converter generates a digital signal according to a timing at which a slope signal generated from an input signal matches a reference signal. However, a multi-channel analog-to-digital converter has a possibility that an error may occur in a digital signal for each channel due to variations in the gradient of the slope signal or an offset voltage and the like of a comparator that compares the slope signal with the reference signal, and the analog-to-digital conversion accuracy may be deteriorated.

The S/N ratio can be improved by averaging the multi-channel digital signals. For example, in the case of M channels, the signal power becomes M times, and the S/N ratio becomes $\sqrt{M}$ times. As described above, even if the number of channels increases to M times, the S/N ratio can be improved only to $\sqrt{M}$ times.

In addition, there is also a method of detecting a differential output using two analog-to-digital converters. However, although there is an effect of reducing distortion by removing in-phase noise, quantization noise cannot be reduced.

DETAILED DESCRIPTION

Figure 1:
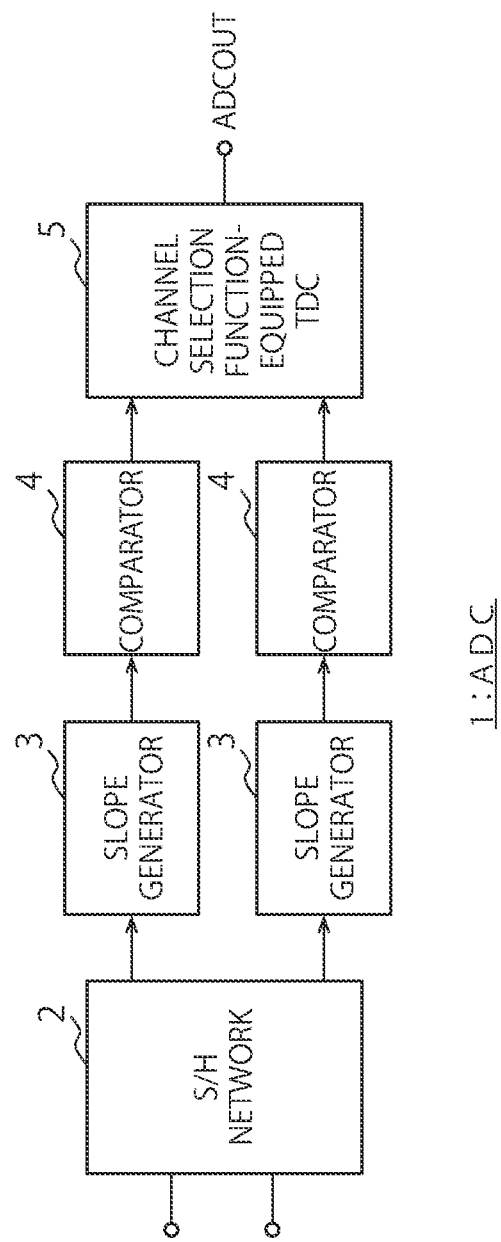
FIG. 1 is a block diagram illustrating a schematic configuration of an ADC.

According to one embodiment, an analog-to-digital converter has:

a first digital signal generator that generates a first digital signal based on whether or not a signal obtained by sampling and holding an input signal is equal to or lower than a signal level of a signal corresponding to a second reference signal having a signal level higher than a signal level of a first reference signal;

a first slope generator configured to generate a first slope signal having a signal level that changes with time from a signal level of the sampled and held signal to a signal level equal to or lower than the first reference signal;

a second slope generator configured to generate a second slope signal having a signal level that changes with time from a signal level of the sampled and held signal to a signal level equal to or lower than the second reference signal; and a second digital signal generator that generates a second digital signal based on a time at which the first slope signal matches the first reference signal or a time at which the second slope signal matches the second reference signal.

The following description will explain embodiments of an analog-to-digital converter and an electronic device with reference to the drawings. Although the following description mainly explains main components of an analog-to-digital converter and an electronic device, the analog-to-digital converter and the electronic device may have components or functions that are not shown in the drawings or not described herein. The following description does not exclude components or functions that are not shown in the drawings or not described herein.

First Embodiment

FIG. 1 is a block diagram illustrating a schematic configuration of an analog-to-digital converter (which will be hereinafter referred to as ADC) 1 capable of analog-to-digital conversion (which will be hereinafter referred to as AD conversion) of two-channel input signals in parallel. The ADC 1 in FIG. 1 includes a sample-and-hold network (which will be hereinafter referred to as S/H network) 2, slope generators 3 and comparators 4 for two channels, and a channel selection function-equipped time-to-digital converter (which will be hereinafter referred to as TDC) 5.

The ADC 1 illustrated in FIG. 1 can generate two-channel digital signals by performing AD conversion on two-channel input signals in parallel.

The S/H network 2 samples and holds an input signal of each channel in synchronization with a clock signal. Although a plurality of internal configurations of the S/H network 2 are conceivable as described later, the S/H network 2 outputs a signal obtained by sampling and holding an input signal of each channel.

Each slope generator 3 generates a slope signal according to a corresponding sample-and-hold signal. Each comparator 4 outputs a signal indicating a timing at which a corresponding slope signal matches a reference signal.

The TDC 5 generates a digital signal corresponding to the corresponding input signal based on the output signal of the corresponding comparator 4 for each channel.

Although the ADC 1 illustrated in FIG. 1 has a two-channel configuration, the number of channels is not limited to two. The ADC 1 in FIG. 1 not only can generate a plurality of digital signals based on multi-channel input signals, but also can improve the accuracy of AD conversion by performing AD conversion on an input signal for one channel by using a plurality of slope generators 3 and comparators 4. As described above, the ADC 1 in FIG. 1 can alternatively select a first mode in which a plurality of digital signals with first bit accuracy corresponding to a plurality of input signals are generated or a second mode in which digital signals with second bit accuracy higher than the first bit accuracy corresponding to the input signals, the number of which (e.g., one) is smaller than that of the first mode, are generated.

When the first mode is selected, AD conversion is performed on a plurality of input signals different for each channel to generate digital signals, the number of which is the number of channels. When the second mode is selected, the S/H network 2, the slope generators 3, the comparators 4, and the TDC 5 for a plurality of channels are used to perform AD conversion on a smaller number of input signals than in the first mode. Therefore, although the number of digital signals to be AD-converted is decreased, the number of bits of the digital signals is increased accordingly, and high accuracy is obtained.

Figure 2:
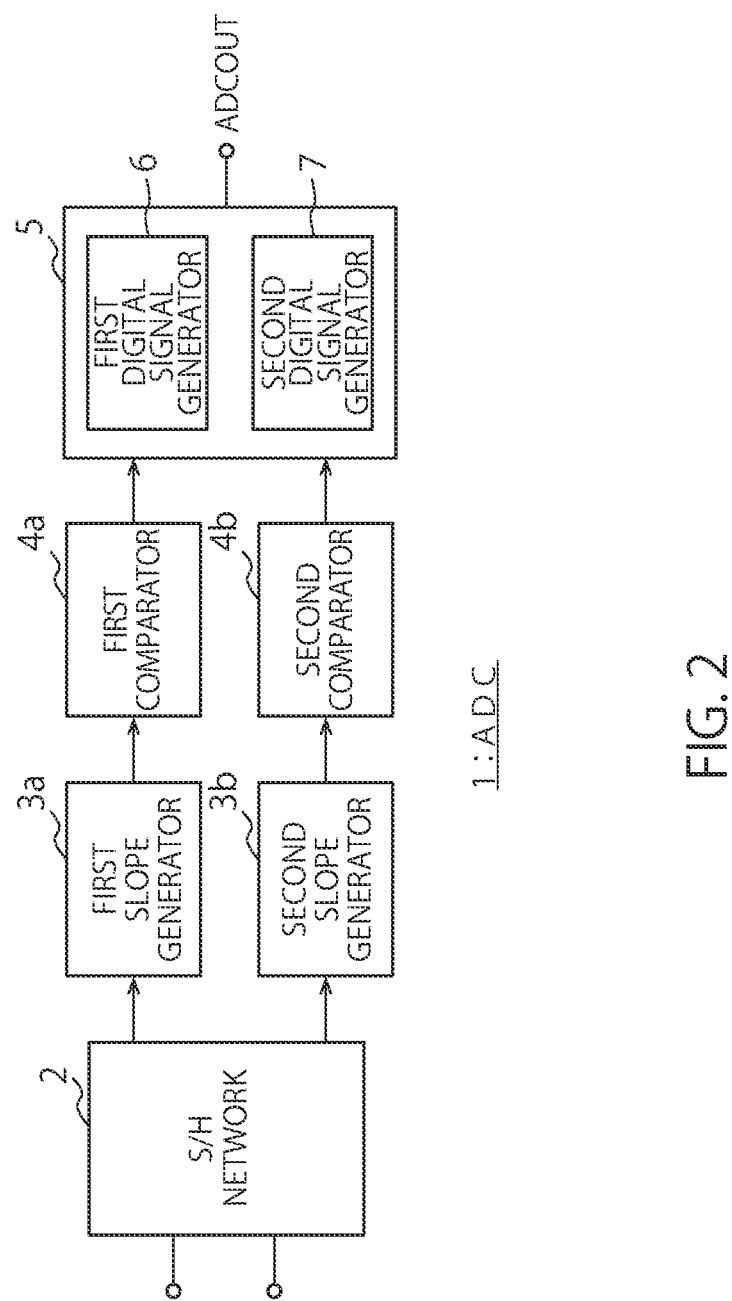
FIG. 2 is a block diagram illustrating the internal configuration of an ADC when a second mode is selected.

FIG. 2 is a block diagram illustrating the internal configuration of the ADC 1 when the second mode is selected. The ADC 1 illustrated in FIG. 2 has a configuration of a case where AD conversion of a one-channel input signal is performed using a configuration for two channels. When the second mode is selected, an input signal for one channel is inputted to the S/H network 2 in FIG. 2.

The ADC 1 in FIG. 2 has the S/H network 2, a first digital signal generator 6, a first slope generator 3a, a second slope generator 3b, a first comparator 4a, a second comparator 4b, and a second digital signal generator 7. The processing of the first digital signal generator 6 and the second digital signal generator 7 is performed by the TDC 5 in FIG. 1.

The first digital signal generator 6 generates a first digital signal based on whether or not a signal obtained by sampling and holding an input signal is equal to or lower than the signal level of a signal corresponding to a second reference signal having a higher signal level than that of the first reference signal. A signal corresponding to the second reference signal may be the second reference signal, or may be a signal having a signal level slightly shifted from that of the second reference signal in a case where an offset or the like is taken into consideration as described later. The first digital signal generator 6 determines whether or not the sampled and held signal is equal to or lower than the second reference signal based on, for example, the output signal of the second comparator 4b.

The first reference signal is, for example, the lowest level voltage (e.g., 0 V) of full scale voltage FS. The full scale voltage FS refers to a maximum voltage and a minimum voltage that can be outputted from the first slope generator 3a and the second slope generator 3b. The second reference signal is, for example, voltage FS/2 that is half the full scale voltage FS. The first digital signal generated by the first digital signal generator 6 is, for example, an upper side bit (MSB in a specific example) of the digital signal generated by the ADC 1 in FIG. 2.

The first slope generator 3a generates a first slope signal having a signal level that changes with time from a signal level of the sampled and held signal to a signal level equal to or lower than the first reference signal. The first slope signal is generated when, for example, the sampled and held signal is equal to or lower than the signal level of the second reference signal.

The second slope generator 3b generates a second slope signal having a signal level that changes with time from the signal level of the sampled and held signal to a signal level equal to or lower than the second reference signal. The second slope signal is generated when, for example, the sampled and held signal is higher than the signal level of the second reference signal.

The first slope generator 3a and the second slope generator 3b respectively generate a first slope signal and a second slope signal in parallel. Alternatively, only one of the first slope generator 3a or the second slope generator 3b may operate. In this case, whether the first slope generator 3a generates the first slope signal or the second slope generator 3b generates the second slope signal is determined based on the first digital signal generated by the first digital signal generator 6.

The first comparator 4a compares the first slope signal with the first reference signal. That is, the first comparator 4a detects a timing at which the first slope signal matches the first reference signal. The second comparator 4b compares the second slope signal with the second reference signal. That is, the second comparator 4b detects a timing at which the second slope signal matches the second reference signal. The first digital signal generator 6 can determine whether or not the sampled and held signal is equal to or lower than the second reference signal based on, for example, the output from the second comparator 4b, and generates the first digital signal based on the output from the second comparator 4b.

The second digital signal generator 7 generates a second digital signal based on a time at which the first slope signal matches the first reference signal or a time at which the second slope signal matches the second reference signal. That is, the second digital signal generator 7 generates a second digital signal according to the time difference between a time at which both or one of the first slope signal and the second slope signal starts to decrease and a time at which both or one of the first slope signal and the second slope signal matches the first reference signal or the second reference signal.

More specifically, the second digital signal generator 7 generates the second digital signal based on the time difference between a time at which the signal level of the first slope signal starts to change and a time at which the first comparator 4a detects matching of the first slope signal with the first reference signal, or the time difference between a time at which the signal level of the second slope signal starts to change and a time at which the second comparator 4b detects matching of the second slope signal with the second reference signal.

The TDC 5 generates a digital signal ADCOUT corresponding to the input signal by using the first digital signal generated by the first digital signal generator 6 and the second digital signal generated by the second digital signal generator 7. The upper side bit (e.g., MSB) of the digital signal is the first digital signal, and the lower side bit is the second digital signal. As described above, the TDC 5 functions as a combiner that combines the first digital signal and the second digital signal to generate the digital signal ADCOUT according to the input signal.

Figure 3:
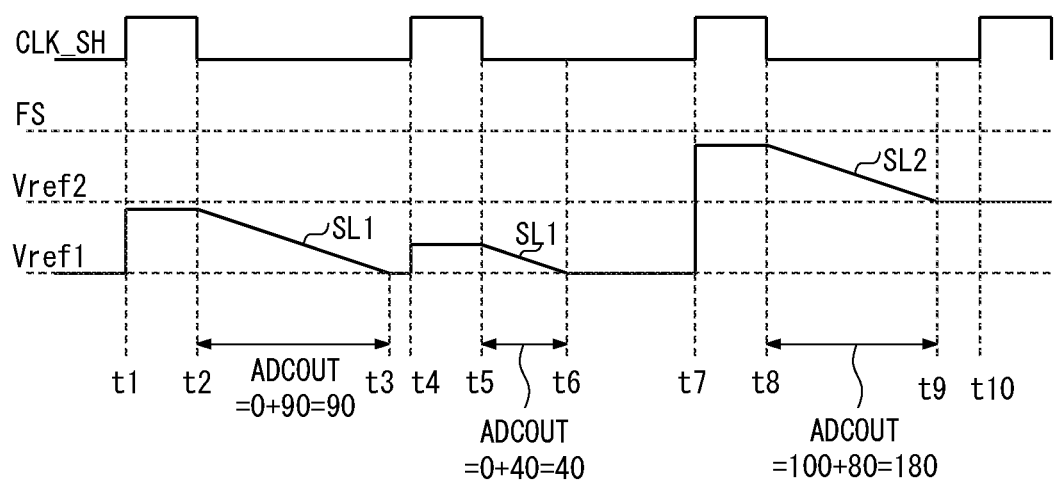
FIG. 3 is a signal waveform diagram of the ADC in FIG. 2.

FIG. 3 is a signal waveform diagram of the ADC 1 in FIG. 2. FIG. 3 illustrates signal waveforms of the clock signal CLK_SH, the first slope signal SL1, the first reference signal Vref1, the second slope signal SL2, and the second reference signal Vref2. In the example in FIG. 3, the first reference signal Vref1 is set to 0 V, and the second reference signal Vref2 is set to FS/2 that is half the full scale voltage FS.

When the clock signal CLK_SH transitions from low to high at time t1 in FIG. 3, the S/H network 2 samples and holds the input signal. The second comparator 4b detects whether or not the sampled and held signal is equal to or lower than the second reference signal Vref2. The first digital signal generator 6 generates the first digital signal based on the output from the second comparator 4b. The first digital signal is an upper side bit (e.g., MSB) of the input signal, and is a bit signal having logic that changes depending on whether or not the sample-and-hold signal is equal to or lower than the second reference signal Vref2. The processing by the first digital signal generator 6 is course AD conversion processing.

The first slope generator 3a and the second slope generator 3b operate in parallel to generate the first slope signal SL1 and the second slope signal SL2. Alternatively, one of the first slope generator 3a or the second slope generator 3b may operate based on the first digital signal to generate the first slope signal SL1 or the second slope signal SL2.

In the example in FIG. 3, since the sampled and held signal is equal to or lower than the voltage level of the second reference signal Vref2, the first slope generator 3a is selected and generates the first slope signal SL1 having a voltage level that gradually degreases after time t2 at which the clock signal CLK_SH transitions from high to low. The first comparator 4a detects matching of the first slope signal SL1 with the first reference signal Vref1 at time t3, and changes the logic of the output signal of the first comparator 4a. As a result, the second digital signal generator 7 generates the first digital signal corresponding to the time difference between times t2 and t3. The AD conversion processing by the second digital signal generator 7 is fine AD conversion processing.

As described above, the ADC 1 in FIG. 2 performs the course AD conversion processing at the first digital signal generator 6 from time t1 to time t2 to select the first slope generator 3a or the second slope generator 3b, and performs the fine AD conversion processing at the second digital signal generator 7 from time t2 to time t3. The ADC 1 in FIG. 2 combines the first digital signal obtained by the course AD conversion processing from time t1 to time t2 and the second digital signal obtained by the fine AD conversion processing from time t2 to time t3 to generate a digital signal according to the input signal.

When the clock signal CLK_SH transitions from low to high again at time t4, the S/H network 2 samples and holds the input signal again. In the example in FIG. 3, the sampled and held signal is lower than the signal level of the second reference signal Vref2. Therefore, the result of the course AD conversion processing by the first digital signal generator 6 is the same as that from time t1 to time t2, and the first slope generator 3a is selected.

The first slope generator 3a generates the first slope signal SL1 having a voltage level that gradually decreases after time t5 at which the clock signal CLK_SH transitions from high to low. The gradient of the first slope signal SL1 is the same as that from time t2 to time t3. However, since the signal level at time t5 is lower than the signal level at time t2, the first comparator 4a detects matching of the first slope signal SL1 with the first reference signal Vref1 with the time difference between times t5 and t6 shorter than the time difference between times t2 and t3, and changes the logic of the output signal of the first comparator 4a. As a result, the second digital signal generator 7 generates a second digital signal according to the time difference between times t5 and t6 by fine AD conversion processing. The ADC 1 in FIG. 2 generates a digital signal corresponding to the input signal based on the first digital signal obtained by the course AD conversion processing from time t4 to time t5 and the second digital signal obtained by the fine AD conversion processing from time t5 to time t6.

When the clock signal CLK_SH transitions from low to high again at time t6, the S/H network 2 samples and holds the input signal again. In the example in FIG. 3, the sampled and held signal is higher than the signal level of the second reference signal Vref2. Therefore, the result of the course AD conversion processing by the first digital signal generator 6 is opposite between from time t1 to time t2 and from time t4 to time t5, and the second slope generator 3b is selected.

The second slope generator 3b generates a second slope signal SL2 having a voltage level that gradually decreases after time t8 at which the clock signal CLK_SH transitions from high to low. The gradient of the second slope signal SL2 is set to be, for example, the same as that of the first slope signal SL1, for example. At time t9, the second comparator 4b detects matching of the second slope signal SL2 with the second reference signal Vref2, and changes the logic of the output signal of the second comparator 4b. As a result, the second digital signal generator 7 generates the second digital signal according to the time difference between times t8 and t9 by fine AD conversion processing. The ADC 1 in FIG. 2 combines the first digital signal obtained by the course AD conversion processing from time t7 to time t8 and the second digital signal obtained by the fine AD conversion processing from time t8 to time t9 to generate a digital signal according to the input signal.

As described above, the ADC 1 in FIG. 1 can change the accuracy of the AD conversion processing depending on whether the first mode is selected or the second mode is selected.

Figure 4A:
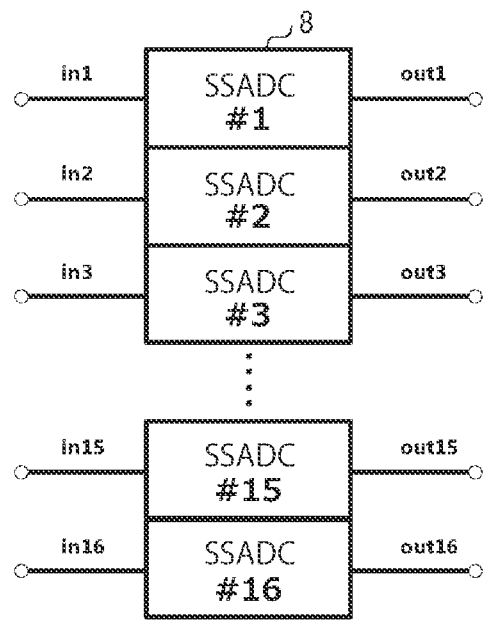
FIG. 4A is a block diagram of a case where a 16-channel ADC is operated in a first mode.
Figure 4B:
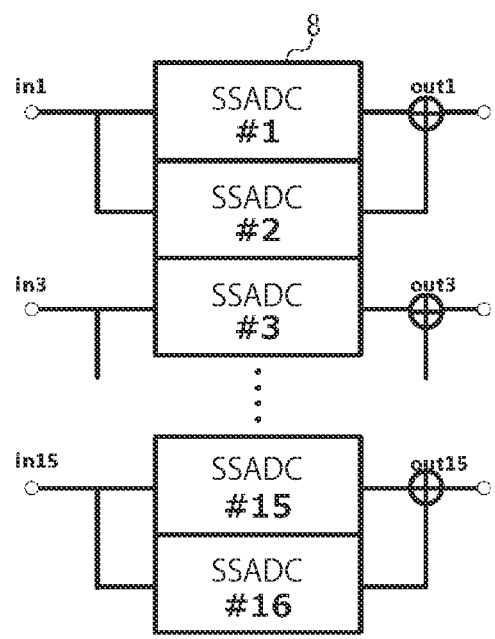
FIG. 4B is a block diagram of a case where a 16-channel ADC is operated in a second mode.

FIGS. 4A and 4B are block diagrams of a 16-channel ADC 1. FIG. 4A is a block diagram of a case where the 16-channel ADC 1 is operated in the first mode, and FIG. 4B is a block diagram of a case where the 16-channel ADC 1 is operated in the second mode. The ADC 1 in FIGS. 4A and 4B has a single slope ADC (SSADC) 8 for each channel. Similarly to FIG. 1, each SSADC 8 has an S/H network 2, slope generators 3, comparators 4, and a TDC 5.

In the first mode, as illustrated in FIG. 4A, slope signals are separately generated based on signals obtained by sampling and holding input signals for 16 channels, and digital signals for 16 channels are generated based on results of comparing the slope signals for 16 channels with reference signals. In the second mode, as illustrated in FIG. 4B, a one-channel input signal is AD-converted with high accuracy for each SSADC 8 for two channels to generate a digital signal. Therefore, digital signals for eight channels are generated. That is, in the second mode, a highly accurate digital signal having eight inputs and eight outputs is generated.

As described above, in the first embodiment, the course AD conversion processing is performed to generate the first digital signal depending on whether or not the signal obtained by sampling and holding the input signal is equal to or lower than the second reference signal Vref2. Then, the first slope generator 3a or the second slope generator 3b is selected based on the first digital signal.

For example, when the sampled and held signal is equal to or lower than the second reference signal Vref2, the first slope generator 3a is selected and generates the second digital signal according to the timing at which the first slope signal SL1 matches the first reference signal Vref1. Moreover, when the sampled and held signal is higher than the second reference signal Vref2, the second slope generator 3b is selected and performs fine AD conversion processing of generating the second digital signal according to the timing at which the second slope signal SL2 matches the second reference signal Vref2.

In the ADC 1 according to the present embodiment, since the results of the course AD conversion processing and the fine AD conversion processing are combined to generate a digital signal according to the input signal, it is possible to generate a highly accurate digital signal without complicating the circuit configuration.

In the present embodiment, a first mode in which AD conversion is performed on the multi-channel input signals in parallel to generate a plurality of digital signals by using the ADC 1 that performs AD conversion on multi-channel input signals, or a second mode in which AD conversion is performed on a smaller number of input signals than in the first mode with high accuracy can be alternatively selected. As a result, multi-channel AD conversion processing and highly accurate AD conversion processing can be alternatively selected and performed by switching the operation mode as necessary.

Second Embodiment

An ADC 1 according to the second embodiment is characterized by being capable of avoiding the influence of the offset voltages and the like of comparators 4. The ADC 1 according to the second embodiment has a block configuration similar to that in FIGS. 1 and 2.

Although the ADC 1 in FIGS. 1 and 2 includes the comparator 4 for each channel, each comparator 4 has a unique offset voltage due to manufacturing variations or the like. Therefore, the comparison result of each comparator 4 includes an error due to the offset voltage. Moreover, the gradient of the slope signal generated by each slope generator 3 may also vary.

Therefore, in the ADC 1 according to the second embodiment, the configuration in FIG. 2, for example, performs the comparison processing at the first comparator 4a and the second comparator 4b in a state where the voltage range of the first slope signal SL1 and the voltage range of the second slope signal SL2 partially overlap each other. This decreases the influence of the offset voltages and the like of the first comparator 4a and the second comparator 4b.

Figure 5:
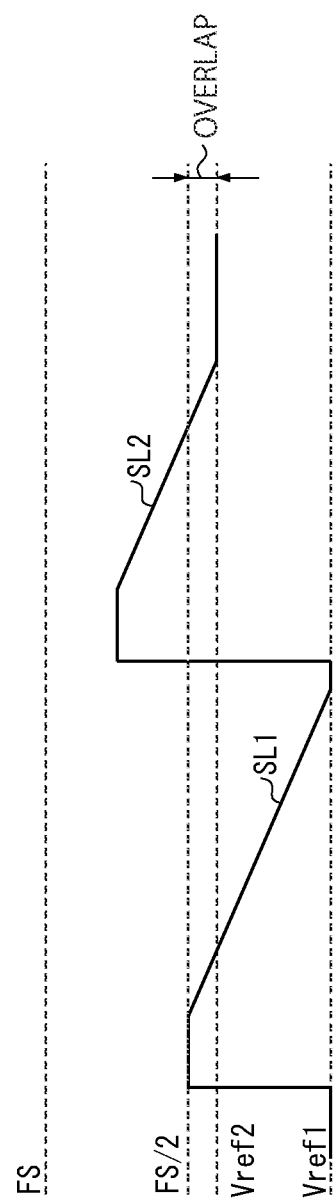
FIG. 5 is a voltage waveform diagram illustrating the comparison voltage range of a first comparator and a second comparator according to a second embodiment.

FIG. 5 is a voltage waveform diagram illustrating voltage ranges to be compared by the first comparator 4a and the second comparator 4b according to the second embodiment. The first slope generator 3a generates the first slope signal SL1 having a signal level that gradually decreases from the signal level of the sampled and held signal equal to or lower than a voltage FS/2 that is half the full-scale voltage FS to a signal level equal to or lower than the signal level (0 V) of the first reference signal Vref1. Although the second reference voltage is set to FS/2 in the first embodiment, the second reference signal Vref2 is set to a voltage level slightly lower than the voltage FS/2 in the present embodiment. The second slope generator 3b generates the second slope signal SL2 having a signal level that gradually decreases from the signal level of the sampled and held signal equal to or lower than the full scale voltage FS to a signal level equal to or lower than the signal level of the second reference signal Vref2.

As a result, the first slope signal SL1 and the second slope signal SL2 include a common voltage range (overlap voltage). For an input signal within the common voltage range, the second digital signal generator 7 can perform offset cancellation calculation based on the output from the first comparator 4a and the output from the second comparator 4b and can generate a second digital signal that avoids the influence of offset or the like.

As described above, in the second embodiment, the signal level of the second reference signal Vref2 is lowered to be lower than half of the full scale voltage FS in consideration of the offset voltages and the like of the first comparator 4a and the second comparator 4b, so that the signal levels of the first slope signal SL1 and the second slope signal SL2 partially overlap each other, and therefore, the digital signal ADCOUT in which the offset voltage and the like have been canceled can be generated.

Although the accuracy of the AD conversion processing of the ADC 1 according to the second embodiment is lower than that of the first embodiment, note that it is possible to avoid the influence of offset voltages and the like of the first comparator 4a and the second comparator 4b and to improve noise resistance.

Third Embodiment

The third embodiment is designed to arbitrarily adjust the gradients of the first slope signal SL1 and the second slope signal SL2 in FIG. 2.

Figure 6:
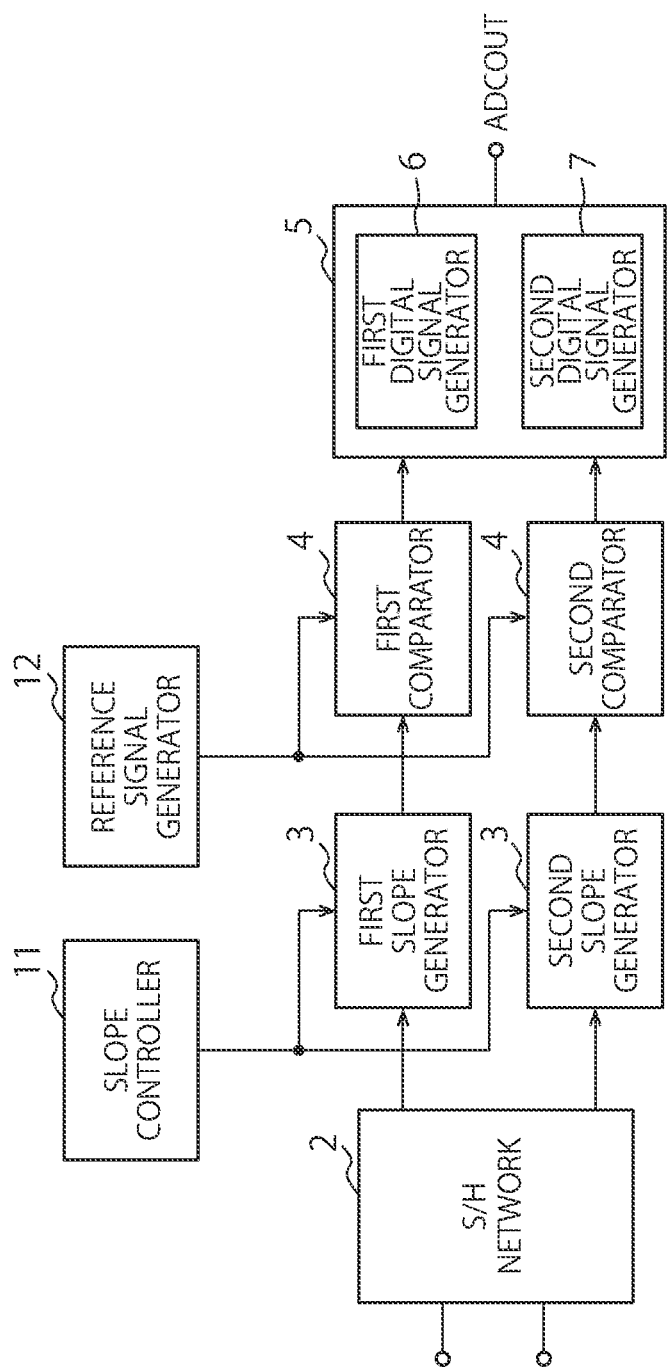
FIG. 6 is a block diagram illustrating a schematic configuration of an ADC according to a third embodiment.

FIG. 6 is a block diagram illustrating a schematic configuration of an ADC 1 according to the third embodiment. The ADC 1 illustrated in FIG. 6 has a configuration in the second mode described above. The ADC 1 in FIG. 6 includes at least one of a slope controller 11 or a reference signal generator 12 in addition to the configuration in FIG. 2.

The slope controller 11 controls a gradient representing a change in the signal level per unit time of each of the first slope signal SL1 and the second slope signal SL2 based on the control signal. By providing the slope controller 11, gradients of the first slope signal SL1 and the second slope signal SL2 can be arbitrarily controlled. The control signal inputted to the slope controller 11 is outputted from, for example, a control circuit (not shown) that controls the ADC 1.

Figure 7:
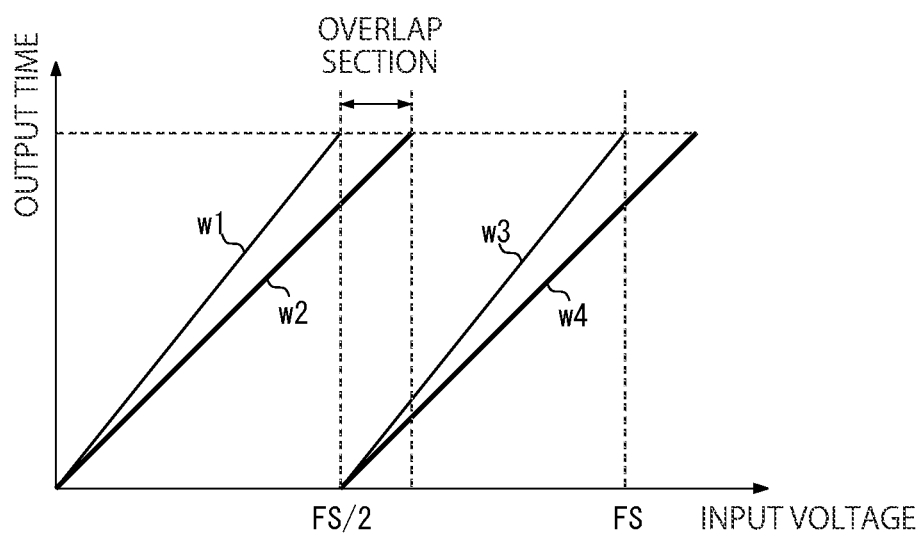
FIG. 7 is a voltage waveform diagram illustrating an example in which a slope controller changes gradients of a first slope signal and a second slope signal.

FIG. 7 is a voltage waveform diagram illustrating an example in which the slope controller 11 changes the gradients of the first slope signal SL1 and the second slope signal SL2. In FIG. 7, the horizontal axis represents the input voltage to the S/H network 2, and the vertical axis represents time. FIG. 7 illustrates waveforms w1 and w2 of the first slope signal SL1, and waveforms w3 and w4 of the second slope signal SL2. The waveforms w1 and w3 indicated by thin solid lines indicate an example in which the first slope signal SL1 and the second slope signal SL2 do not overlap each other, and the waveforms w2 and w4 indicated by thick solid lines indicate an example in which the first slope signal SL1 and the second slope signal SL2 partially overlap each other. The rectangular range in FIG. 7 is the overlap section. In a case where the offset variations of the first comparator 4a and the second comparator 4b are large, the slope controller 11 controls the gradients of the first slope signal SL1 and the second slope signal SL2 as in waveforms w2 and w4 so as to overlap the first slope signal SL1 and the second slope signal SL2. Since the AD conversion processing is performed for the overlap section based on the comparison results of both the first comparator 4a and the second comparator 4b, the offset cancellation calculation can be performed, and a second digital signal that avoids the influence of offset can be generated.

The ADC 1 in FIG. 6 may include a reference signal generator 12. The reference signal generator 12 in FIG. 6 generates a first reference signal Vref1 and a second reference signal Vref2. The first comparator 4a detects a time at which the first slope signal SL1 matches the first reference signal Vref1, and the second comparator 4b detects a time at which the second slope signal SL2 matches the second reference signal Vref2. Therefore, the reference signal generator 12 can switch the AD conversion accuracy by controlling the signal levels of the first reference signal Vref1 and the second reference signal Vref2.

In a case where the number of channels of the ADC 1 increases and the AD conversion processing is performed with accuracy corresponding to the number of channels accordingly, the slope controller 11 controls the gradient of each slope signal according to the number of channels, and the reference signal generator 12 adjusts the signal level of each reference signal, so that a reconfigurable ADC 1 is obtained.

As described above, since the ADC 1 according to the third embodiment includes at least one of the slope controller 11 or the reference signal generator 12, it is possible to implement a reconfigurable and versatile ADC 1 that can control the gradients of the first slope signal SL1 and the second slope signal SL2 and control the signal levels of the first reference signal Vref1 and the second reference signal Vref2, is hardly influenced by the offset voltages and the like of the first comparator 4a and the second comparator 4b, and is adaptable to increase or decrease the number of channels.

Fourth Embodiment

In the fourth embodiment, the configuration of a two-channel ADC 1 that maximizes the AD conversion accuracy will be described.

Figure 8:
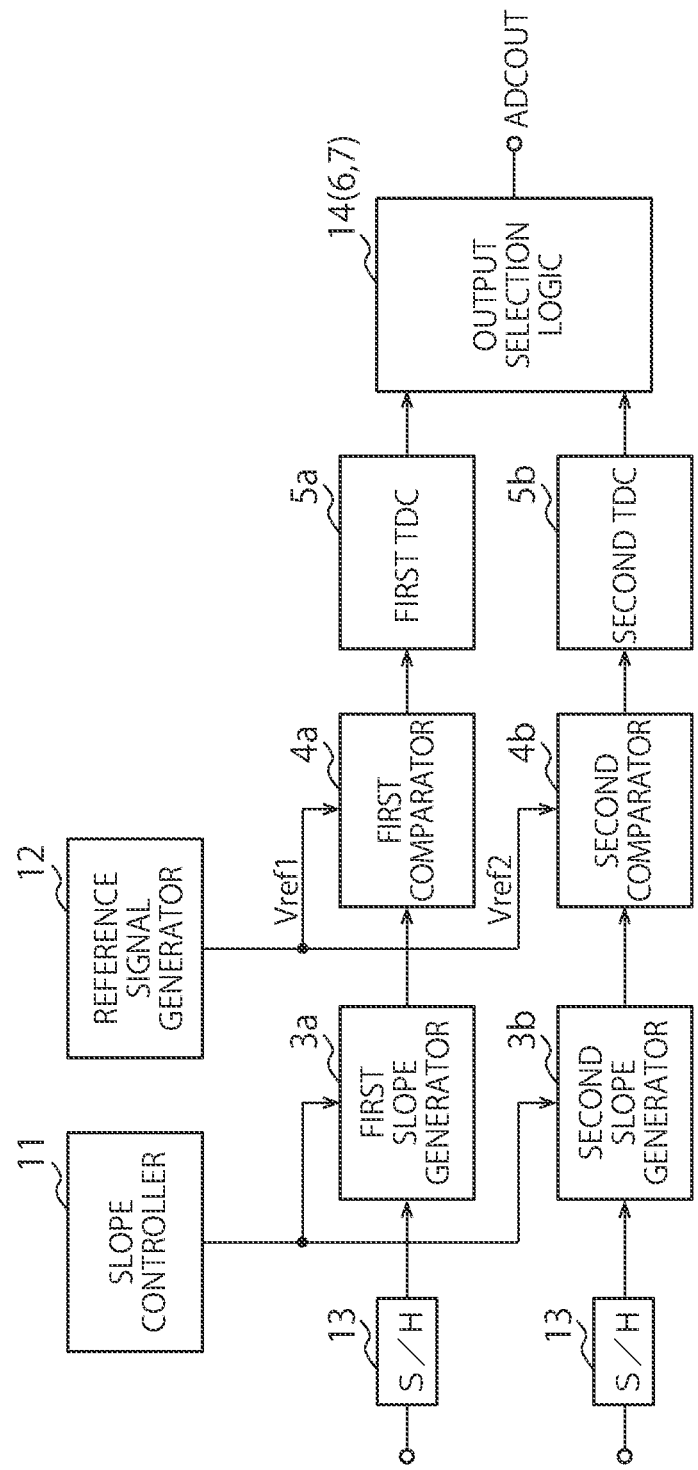
FIG. 8 is a block diagram illustrating a schematic configuration of an ADC according to a fourth embodiment.

FIG. 8 is a block diagram illustrating a schematic configuration of an ADC 1 according to the fourth embodiment. The ADC 1 illustrated in FIG. 8 has a configuration in the second mode described above. The ADC 1 illustrated in FIG. 8 has a two-channel configuration, and has two S/H units 13 as a specific configuration of the S/H network 2. Moreover, the ADC 1 in FIG. 8 includes at least one of a slope controller 11 or a reference signal generator 12 as in FIG. 6. Furthermore, the ADC 1 in FIG. 8 has a first TDC 5a, a second TDC 5b, and an output selection logic unit 14 as a specific configuration of the channel selection function-equipped TDC 5. The first TDC 5a and the second TDC 5b correspond to the second digital signal generator 7 in FIG. 1. Moreover, the output selection logic unit 14 includes a first digital signal generator 6.

The AD conversion accuracy of the two-channel ADC1 can be most improved in a case where the voltage levels of both the first slope signal SL1 and the second slope signal SL2 change with a voltage width of FS/2 over one cycle from a fall of the clock signal CLK_SH to the next fall of the clock signal CLK_SH in a state where the first reference signal Vref1 is set to the minimum voltage (e.g., 0 V) of the full scale voltage FS and the second reference signal Vref2 is set to a voltage FS/2 that is half the full scale voltage FS. The signal waveform diagram in this case is similar to that of FIG. 3. The following description will explain the operation of the ADC 1 in FIG. 8 with reference to FIG. 3.

The S/H unit 13 samples and holds the input signal at a timing at which the clock signal CLK_SH transitions from low to high. The second comparator 4b compares the sampled and held signal with FS/2 that is the second reference signal Vref2. The first digital signal generator 6 in the output selection logic unit 14 sets the first digital signal that is the upper side bit (e.g., MSB) of the digital signal depending on whether or not the sampled and held signal is equal to or higher than the second reference voltage based on the output from the second comparator 4b. This is 1-bit quantization and is course AD conversion processing. As described above, the first digital signal that is the upper side bit of the digital signal can be set based on the signal level of the sampled and held signal, and the first slope generator 3a or the second slope generator 3b is selected.

Thereafter, when the clock signal CLK_SH falls, the first slope generator 3a or the second slope generator 3b generates the first slope signal SL1 or the second slope signal SL2. In the example in FIG. 2, since the signal level of the sampled and held signal is equal to or lower than the second reference signal Vref2, the first slope generator 3a is selected and generates the first slope signal SL1. The first comparator 4a detects a timing at which the first slope signal SL1 matches the first reference signal Vref1. The first TDC 5a quantizes the time difference between time t2 at which the signal level of the first slope signal SL1 starts to decrease and time t3 at which the first slope signal SL1 matches the first reference signal Vref1, and generates a second digital signal.

From time t1 to time t6, since the signal level of the sampled and held signal is equal to or lower than the second reference signal Vref2, the second digital signal is generated by the first slope generator 3a, the first comparator 4a, and the first TDC 5a. From time t6 to time t9, since the signal level of the sampled and held signal is higher than the second reference signal Vref2, the second digital signal is generated by the second slope generator 3b, the second comparator 4b, and the second TDC 5b. The AD conversion processing by the first TDC 5a and the second TDC 5b is fine AD conversion processing.

As described above, it is possible to detect whether or not the sampled and held signal is equal to or lower than the second reference signal Vref2 on based on the outputs from the first comparator 4a and the second comparator 4b, and the first digital signal generator 6 in the output selection logic unit 14 can determine the upper side bit (e.g., MSB) of the digital signal based on the outputs from the first comparator 4a and the second comparator 4b.

Figure 9:
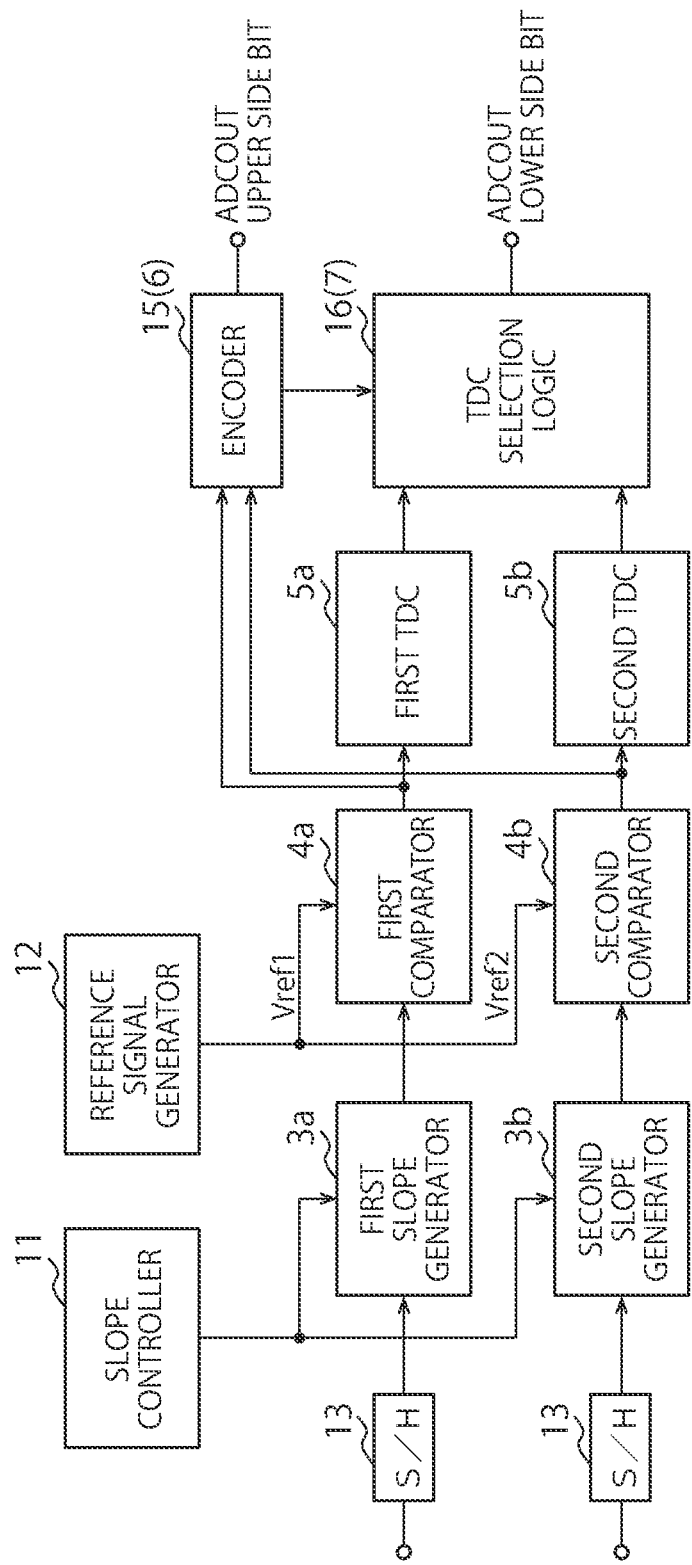
FIG. 9 is a block diagram of an ADC according to a first variation of the fourth embodiment.

FIG. 9 is a block diagram of an ADC 1 according to the first variation of the fourth embodiment. The ADC 1 in FIG. 9 includes an encoder 15 and a TDC selection logic unit 16 instead of the output selection logic unit 14 in FIG. 8.

The encoder 15 encodes the outputs from the first comparator 4a and the second comparator 4b to generate an MSB (first digital signal) of a digital signal. The TDC selection logic unit 16 selects any one of the output from the first TDC 5a or the output from the second TDC 5b based on the encoding result of the encoder 15, and outputs a lower side bit string (second digital signal) of the digital signal.

Figure 10:
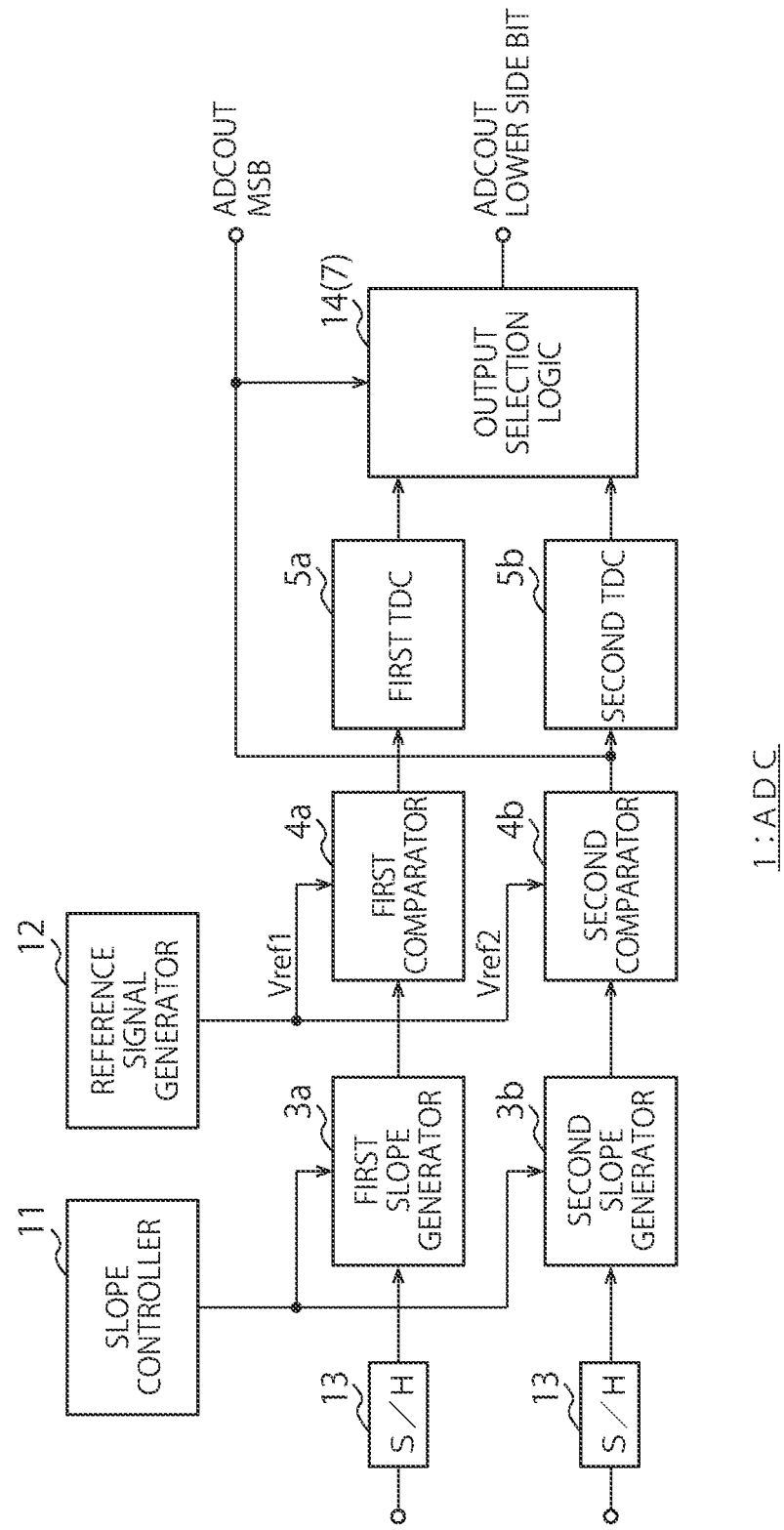
FIG. 10 is a block diagram of an ADC according to a second variation of the fourth embodiment.

FIG. 10 is a block diagram of an ADC 1 according to the second variation of the fourth embodiment. The ADC 1 in FIG. 10 has a configuration in which the encoder 15 is omitted from the ADC 1 in FIG. 9. The ADC 1 in FIG. 10 selects any one of the first TDC 5a or the second TDC 5b based on the output from the second comparator 4b, and outputs a lower side bit string (second digital signal) of the digital signal. Therefore, the second comparator 4b also serves as the first digital signal generator 6.

When the signal level of the sampled and held signal exceeds the second reference signal Vref2, the second slope generator 3b outputs the second slope signal SL2. The second comparator 4b detects a timing at which the second slope signal SL2 matches the second reference signal Vref2. Whether or not the sampled and held signal, that is, the input signal exceeds the second reference signal Vref2 can be determined depending on whether or not the output from the second comparator 4b is valid. Therefore, the TDC selection logic unit 16 selects the output from the first TDC 5a when the input signal is equal to or lower than the second reference signal Vref2, or selects the output from the second TDC 5b when the input signal exceeds the second reference signal Vref2.

Although examples of a two-channel ADC 1 have been described in FIGS. 8 to 10, the AD conversion accuracy may be improved by using three or more channels. For example, in a case where the AD conversion accuracy is improved by using four channels, the full scale voltage FS is divided into four, four slope signals having signal levels that gradually change within four divided voltage ranges, and four reference signals are provided, and the AD conversion processing is performed. As a result, the S/N ratio for two bits can be improved as compared with a case where AD conversion is performed for each channel. As described above, it is possible with the present embodiment to implement a MIMO-SSADC capable of improving the S/N ratio in proportion to the number of channels M.

As described above, in the fourth embodiment, the MSB (first digital signal) of the digital signal can be generated by at least one of the first comparator 4a or the second comparator 4b. Moreover, the lower side bit (second digital signal) of the digital signal can be generated by using any one of the output from the first TDC 5a or the output from the second TDC 5b.

Fifth Embodiment

Although the ADCs 1 in FIGS. 8 to 10 each include an S/H unit 13, a slope generator 3, a comparator 4, and a TDC 5 for each channel, an S/H unit 13 and a slope generator 3 are shared by channels in the fifth embodiment.

Figure 11:
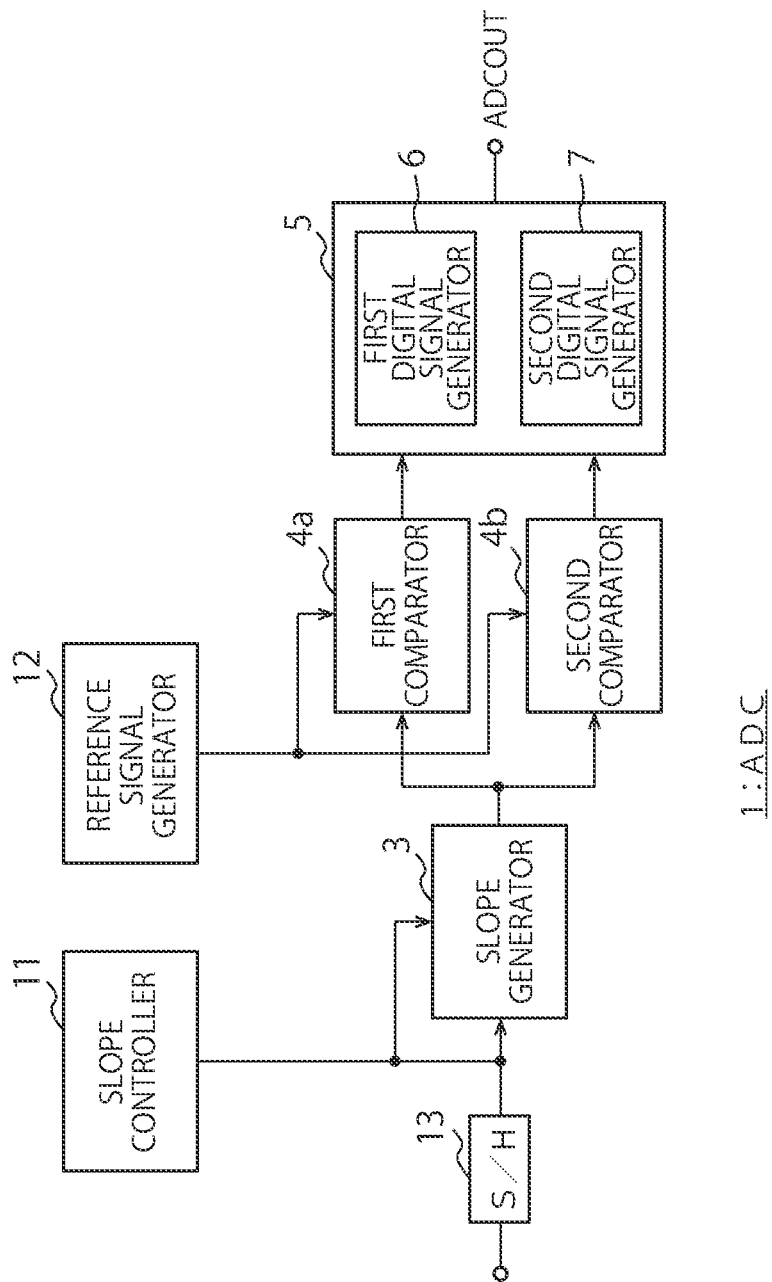
FIG. 11 is a block diagram of an ADC according to a fifth embodiment.

FIG. 11 is a block diagram of an ADC 1 according to the fifth embodiment. The ADC 1 illustrated in FIG. 11 has a two-channel configuration. An S/H unit 13 and a slope generator 3 are shared by two channels. A slope signal generated by the slope generator 3 is inputted to the first comparator 4a and the second comparator 4b. The slope generator 3 adjusts the gradient of the slope signal under the control of the slope controller 11. The slope generator 3 in FIG. 11 serves as both the first slope generator 3a and the second slope generator 3b.

When a signal indicating the magnitude relationship between the sampled and held signal and the second reference signal Vref2 is outputted from the second comparator 4b before the AD conversion processing is started, the slope generator 3 generates a slope signal according to the output from the second comparator 4b and sends the slope signal to the first comparator 4a or the second comparator 4b.

For example, when the signal level of the signal sampled and held by the S/H unit 13 is equal to or lower than the second reference signal Vref2, the slope generator 3 generates a slope signal having a signal level that gradually decreases from the signal level of the sampled and held signal to a signal level equal to or lower than the first reference signal Vref1. This slope signal is supplied to the first comparator 4a. Moreover, the gradient of this slope signal is controlled by the slope controller 11. Moreover, when the signal level of the signal sampled and held by the S/H unit 13 is higher than the second reference signal Vref2, the slope generator 3 generates a slope signal having a signal level that gradually decreases from the signal level of the sampled and held signal to a signal level equal to or lower than the second reference signal Vref2. This slope signal is supplied to the second comparator 4b.

The output from the first comparator 4a and the output from the second comparator 4b are inputted to the channel selection function-equipped TDC 5. This TDC 5 may include the first TDC 5a, the second TDC 5b, and the output selection logic unit 14 in FIG. 8. Alternatively, the TDC 5 may include the first TDC 5a, the second TDC 5b, the encoder 15, and the TDC selection logic unit 16 in FIG. 9. Alternatively, the TDC 5 may include the first TDC 5a, the second TDC 5b, and the TDC selection logic unit 16 in FIG. 10.

As described above, in the fifth embodiment, since an S/H unit 13 and a slope generator 3 are shared by channels in a case where the AD conversion accuracy is improved using a plurality of channels, the internal configuration of the ADC 1 can be simplified, the power consumption can be reduced, and the size can be reduced.

Sixth Embodiment

The sixth embodiment embodies the internal configurations of the S/H network 2 and the channel selection function-equipped TDC 5 described in each of the embodiments described above.

Figure 12A:
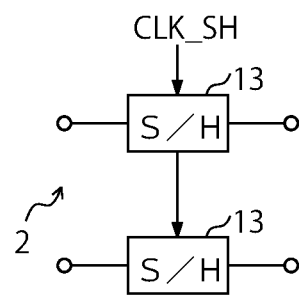
FIG. 12A is a block diagram of an S/H network according to a first example.

FIG. 12A is a block diagram of an S/H network 2 according to a first example. The S/H network 2 in FIG. 12 has a plurality of S/H units 13 having independent input and output. Although FIG. 12A includes the S/H unit 13 with two inputs and two outputs, the number of inputs and outputs is not particularly limited. The plurality of S/H units 13 in FIG. 12A sample and hold the input signals for a plurality of channels in synchronization with the common clock signal CLK_SH.

Figure 12B:
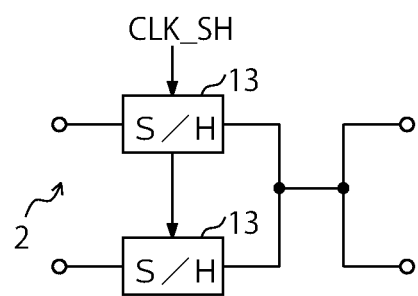
FIG. 12B is a block diagram of an S/H network according to a second example.

FIG. 12B is a block diagram of an S/H network 2 according to a second example. The S/H network 2 in FIG. 12B has a plurality of independent inputs and a common output. In FIG. 12B, a plurality of input signals are separately sampled and held, and the plurality of sampled and held signals are aggregated into one signal and outputted.

Figure 12C:
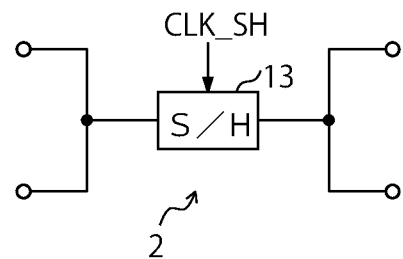
FIG. 12C is a block diagram of an S/H network according to a third example.

FIG. 12C is a block diagram of an S/H network 2 according to a third example. The S/H network 2 in FIG. 12C aggregates inputs into one signal and also aggregates outputs into one signal. For example, the ADC 1 in FIG. 11 can include the S/H network 2 in FIG. 12C.

Figure 13A:
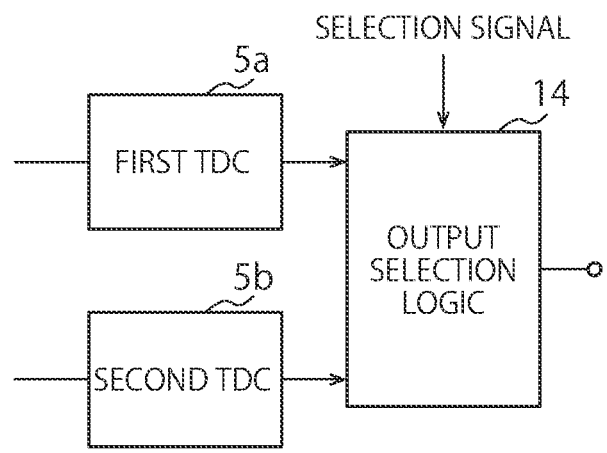
FIG. 13A is a block diagram of a channel selection function-equipped TDC according to a first example.

FIG. 13A is a block diagram of a channel selection function-equipped TDC 5 according to a first example. The channel selection function-equipped TDC 5 in FIG. 13A has a plurality of TDCs (e.g., first TDC 5a and second TDC 5b) and an output selection logic unit 14. The plurality of TDCs 5a and 5b generate a second digital signal corresponding to a timing at which different slope signals match corresponding reference signals. As a result, the channel selection function-equipped TDC 5 in FIG. 13A can accurately perform the AD conversion processing.

Figure 13B:
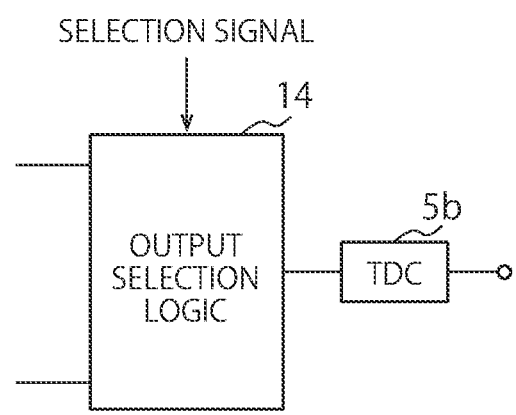
FIG. 13B is a block diagram of a channel selection function-equipped TDC according to a second example.

FIG. 13B is a block diagram of a channel selection function-equipped TDC 5 according to a second example. Regarding the channel selection function-equipped TDC 5 in FIG. 13B, the TDC 5 is provided at the subsequent stage of the output selection logic unit 14. The output selection logic unit 14 selects any one of the output from the first comparator 4a or the output from the second comparator 4b. The selected output from the first comparator 4a or the second comparator 4b is inputted to the TDC 5 to generate a second digital signal. According to the configuration in FIG. 13B, since the number of TDCs 5 can be reduced as compared with FIG. 13A, the size of the ADC 1 can be reduced, and the power consumption can also be reduced.

As described above, a plurality of internal configurations of the S/H network 2 and the channel selection function-equipped TDC 5 described in the first to fifth embodiments are conceivable, and it is desirable to select an S/H network 2 and a channel selection function-equipped TDC 5 having optimal internal configurations as necessary.

Seventh Embodiment

Figure 14:
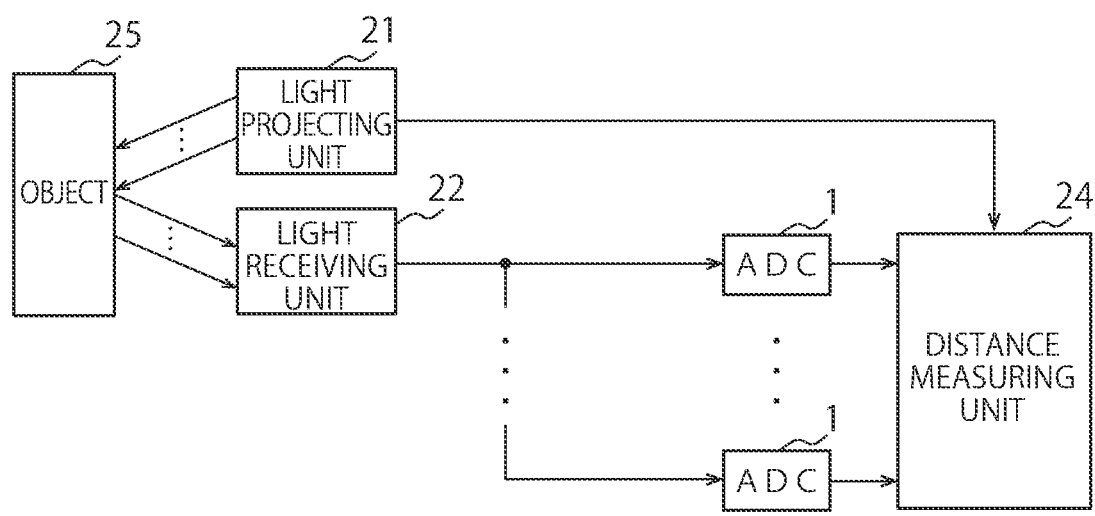
FIG. 14 is a block diagram illustrating a schematic configuration of an electronic device.

An ADC 1 having an oscillation circuit 1 according to the first to sixth embodiments described above can be used, for example, in an electronic device that performs distance measurement using the propagation time of an optical signal. FIG. 14 is a block diagram illustrating a schematic configuration of an electronic device 20. The electronic device 20 in FIG. 14 includes an ADC 1 according to the first to sixth embodiments.

The electronic device 20 in FIG. 14 has a light projecting unit 21, a light receiving unit 22, ADCs 1, and a distance measuring unit 24.

The light projecting unit 21 projects multi-channel optical signals to an object 25. The optical signal is, for example, a pulse signal, and the light projecting unit 21 intermittently projects multi-channel optical signals at predetermined time intervals. The object 25 reflects the multi-channel optical signals from the light projecting unit 21. The light receiving unit 22 receives the multi-channel optical signals reflected at the object 25 and converts the optical signals into analog electric signals (which will be hereinafter referred to as reception signals).

The multi-channel time signals are inputted to the ADC 1 according to the first to sixth embodiments, for example, and are converted into multi-channel digital signals. The distance measuring unit 24 measures the distance to the object 25 based on the digital signal outputted from the ADC 1.

Since the ADC 1 according to the first to sixth embodiments can perform the AD conversion processing with high accuracy, the distance to the object 25 can be accurately measured by using this ADC 1 in the electronic device 20. While certain embodiments have been described, these embodiments have been presented by way of example only, and are not intended to limit the scope of the disclosures. Indeed, the novel methods and systems described herein may be embodied in a variety of other forms; furthermore, various omissions, substitutions and changes in the form of the methods and systems described herein may be made without departing from the spirit of the disclosures. The accompanying claims and their equivalents are intended to cover such forms or modifications as would fall within the scope and spirit of the disclosures.

The invention claimed is:

1. An analog-to-digital converter comprising:
 a first digital signal generator that generates a first digital signal based on whether or not a signal obtained by sampling and holding an input signal is equal to or lower than a signal level of a signal corresponding to a second reference signal having a signal level higher than a signal level of a first reference signal;
 a first slope generator configured to generate a first slope signal having a signal level that changes with time from a signal level of the sampled and held signal to a signal level equal to or lower than the first reference signal;
 a second slope generator configured to generate a second slope signal having a signal level that changes with time from a signal level of the sampled and held signal to a signal level equal to or lower than the second reference signal; and
 a second digital signal generator that generates a second digital signal based on a time at which the first slope signal matches the first reference signal or a time at which the second slope signal matches the second reference signal.

2. The analog-to-digital converter according to claim 1, wherein the first slope generator or the second slope generator is selected based on the first digital signal and generates the first slope signal or the second slope signal.

3. The analog-to-digital converter according to claim 1, further comprising
 a combiner that combines the first digital signal and the second digital signal to generate a digital signal according to the input signal.

4. The analog-to-digital converter according to claim 3, wherein the combiner generates the digital signal having the first digital signal as an upper side bit and the second digital signal as a lower side bit.

5. The analog-to-digital converter according to claim 1, further comprising:
 a first comparator that detects whether or not the first slope signal matches the first reference signal; and
 a second comparator that detects whether or not the second slope signal matches the second reference signal,
 wherein the second digital signal generator generates the second digital signal based on a time difference between a time at which a signal level of the first slope signal starts to change and a time at which the first comparator detects matching of the first slope signal and the first reference signal, or a time difference between a time at which a signal level of the second slope signal starts to change and a time at which the second comparator detects matching of the second slope signal and the second reference signal.

6. The analog-to-digital converter according to claim 5, wherein the first digital signal generator generates the first digital signal based on an output from the second comparator.

7. The analog-to-digital converter according to claim 1, further comprising
 a reference signal generator that generates the first reference signal and the second reference signal.

8. The analog-to-digital converter according to claim 1, further comprising
 a slope controller that controls a gradient representing a change in a signal level per unit time between the first slope signal and the second slope signal based on a control signal.

9. The analog-to-digital converter according to claim 8, wherein the slope controller equalizes gradients of the first slope signal and the second slope signal.

10. The analog-to-digital converter according to claim 1,
wherein a first mode in which a plurality of input signals are converted into a plurality of digital signals with first bit accuracy and a second mode in which a smaller number of input signals than in the first mode are converted into digital signals with second bit accuracy higher than the first bit accuracy is alternatively selected, and the first digital signal generator, the first slope generator, the second slope generator, and the second digital signal generator are used to generate the digital signal according to a smaller number of input signals than the plurality of input signals when the second mode is selected.

11. The analog-to-digital converter according to claim 10,
wherein the first slope generator generates the first slope signal having a signal level that is converted with time from a signal level of a signal obtained by sampling and holding a first input signal to a signal level equal to or lower than a predetermined reference signal when the first mode is selected, the second slope generator generates the second slope signal having a signal level that is converted with time from a signal level of a signal obtained by sampling and holding a second input signal to a signal level equal to or lower than the predetermined reference signal when the first mode is selected, and the second digital signal generator generates a digital signal corresponding to the first input signal based on a time at which the first slope signal matches the predetermined reference signal, and generates a digital signal corresponding to the second input signal based on a time at which the second slope signal matches the predetermined reference signal.

12. The analog-to-digital converter according to claim 10, further comprising
a reference signal generator that generates n (n is an integer of 2 or more) reference signals having different signal levels according to bit accuracy of the digital signal when the second mode is selected,
wherein the n reference signals include the first reference signal and the second reference signal.

13. The analog-to-digital converter according to claim 12,
wherein the n reference signals are n voltage signals different for each equal voltage width.

14. The analog-to-digital converter according to claim 12,
wherein the n reference signals are a plurality of voltage signals obtained by equally dividing a full scale voltage.

15. The analog-to-digital converter according to claim 12, further comprising
a slope controller that controls gradients of n slope signals including the first slope signal and the second slope signal based on a control signal and the n reference signals.

16. The analog-to-digital converter according to claim 15,
wherein the slope controller equalizes gradients of the n slope signals.

17. The analog-to-digital converter according to claim 1,
wherein signal levels of the first slope signal and the second slope signal partially overlap with each other.

18. An electronic device comprising:
a light receiving unit that receives a plurality of optical signals reflected at a plurality of places of an object and generates a plurality of reception signals;
an analog-to-digital converter that generates a plurality of digital signals based on the plurality of reception signals; and
a distance measuring unit that measures a distance to the object based on the plurality of digital signals,
wherein the analog-to-digital converter includes:
a first digital signal generator that generates a first digital signal based on whether or not a signal obtained by sampling and holding the reception signal is equal to or lower than a signal level of a signal corresponding to a second reference signal having a signal level higher than a signal level of a first reference signal;
a first slope generator that generates a first slope signal having a signal level that changes with time from a signal level of the sampled and held signal to a signal level equal to or lower than the first reference signal;
a second slope generator that generates a second slope signal having a signal level that changes with time from a signal level of the sampled and held signal to a signal level equal to or lower than the second reference signal; and
a second digital signal generator that generates a second digital signal based on a time at which the first slope signal matches the first reference signal or a time at which the second slope signal matches the second reference signal.

19. The electronic device according to claim 18,
wherein a first mode in which the plurality of reception signals are converted into the plurality of digital signals with a first bit accuracy and a second mode in which a smaller number of reception signals than in the first mode are converted into the digital signals with a second bit accuracy higher than the first bit accuracy is alternatively selected, and the first digital signal generator, the first slope generator, the second slope generator, and the second digital signal generator are used to generate the digital signal corresponding to a smaller number of reception signals than the plurality of reception signals when the second mode is selected.

20. The electronic device according to claim 19, further comprising
a reference signal generator that generates n (n is an integer of 2 or more) reference signals of different signal levels according to bit accuracy of the digital signal when the second mode is selected,
wherein the n reference signals include the first reference signal and the second reference signal.

\* \* \* \* \*